United States Patent
Ghani et al.

(10) Patent No.: US 10,396,079 B2
(45) Date of Patent: Aug. 27, 2019

(54) NON-PLANAR SEMICONDUCTOR DEVICE HAVING DOPED SUB-FIN REGION AND METHOD TO FABRICATE SAME

(71) Applicant: Intel Corporation, Santa Clara, CA (US)

(72) Inventors: Tahir Ghani, Portland, OR (US); Salman Latif, Sunnyvale, CA (US); Chanaka D. Munasinghe, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/103,430

(22) Filed: Aug. 14, 2018

(65) Prior Publication Data

US 2019/0006362 A1 Jan. 3, 2019

Related U.S. Application Data

(63) Continuation of application No. 14/779,936, filed as application No. PCT/US2013/046902 on Jun. 20, 2013, now Pat. No. 10,056,380.

(51) Int. Cl.
*H01L 29/08* (2006.01)
*H01L 29/66* (2006.01)
(Continued)

(52) U.S. Cl.
CPC ...... *H01L 27/0924* (2013.01); *H01L 21/2255* (2013.01); *H01L 21/26513* (2013.01);
(Continued)

(58) Field of Classification Search
CPC ............. H01L 27/0927; H01L 27/0886; H01L 29/0847; H01L 21/23821
(Continued)

(56) References Cited

U.S. PATENT DOCUMENTS 5,908,307 A 6/1999 Talwar et al.
6,835,967 B2 * 12/2004 Yeo .................. H01L 27/0255
257/104
(Continued)

FOREIGN PATENT DOCUMENTS

CN 1532948 9/2004
CN 1694262 11/2005
(Continued)

OTHER PUBLICATIONS

International Search Report and Written Opinion of the International Searching Authority dated Mar. 26, 2014, in International Patent Application No. PCT/US2013/046902.
(Continued)

*Primary Examiner* — Bo Fan
(74) *Attorney, Agent, or Firm* — Schwabe, Williamson & Wyatt, P.C.

(57) ABSTRACT

Non-planar semiconductor devices having doped sub-fin regions and methods of fabricating non-planar semiconductor devices having doped sub-fin regions are described. For example, a method of fabricating a semiconductor structure involves forming a plurality of semiconductor fins above a semiconductor substrate. A solid state dopant source layer is formed above the semiconductor substrate, conformal with the plurality of semiconductor fins. A dielectric layer is formed above the solid state dopant source layer. The dielectric layer and the solid state dopant source layer are recessed to approximately a same level below a top surface of the plurality of semiconductor fins, exposing protruding portions of each of the plurality of semiconductor fins above sub-fin regions of each of the plurality of semiconductor fins. The method also involves driving dopants from the solid state dopant source layer into the sub-fin regions of each of the plurality of semiconductor fins.

20 Claims, 11 Drawing Sheets

(51) Int. Cl.
| | |
|---|---|
| *H01L 21/225* | (2006.01) |
| *H01L 21/265* | (2006.01) |
| *H01L 27/088* | (2006.01) |
| *H01L 27/092* | (2006.01) |
| *H01L 21/3105* | (2006.01) |
| *H01L 21/8234* | (2006.01) |
| *H01L 21/8238* | (2006.01) |

(52) U.S. Cl.
CPC ............. *H01L 21/31051* (2013.01); *H01L 21/823431* (2013.01); *H01L 21/823814* (2013.01); *H01L 21/823821* (2013.01); *H01L 27/0886* (2013.01); *H01L 29/0847* (2013.01); *H01L 29/66803* (2013.01)

(58) Field of Classification Search
USPC ............. 257/401, 413, 751; 438/585, 258
See application file for complete search history.

(56) References Cited

U.S. PATENT DOCUMENTS

| | | | |
|---|---|---|---|
| 2006/0118876 | A1 | 6/2006 | Lee et al. |
| 2007/0023817 | A1 | 2/2007 | Dao |
| 2009/0215277 | A1 | 8/2009 | Lee et al. |
| 2010/0163926 | A1 | 7/2010 | Hudait et al. |
| 2011/0309333 | A1 | 12/2011 | Cheng et al. |
| 2012/0009749 | A1* | 1/2012 | Tan ................ B82Y 10/00 438/284 |
| 2013/0280883 | A1* | 10/2013 | Faul ................ H01L 21/2255 438/434 |
| 2016/0343623 | A1* | 11/2016 | Fogel ............. H01L 21/823878 |

FOREIGN PATENT DOCUMENTS

| | | |
|---|---|---|
| CN | 1326253 | 7/2007 |
| CN | 102237278 | 11/2011 |
| EP | 1844498 | 3/2012 |
| KR | 10-1163224 | 7/2012 |

OTHER PUBLICATIONS

Office Action for Great Britain Patent Application No. GB1520166.8 dated Aug. 1, 2017, 1 pg.
Office Action and Search Report for Great Britain Patent Application No. GB1710896.0 dated Aug. 1, 2017, 2 pg.
Notice of Allowance and Search Report for Taiwan Patent Application No. 106112627 dated Sep. 4, 2017, 3 pgs., no English translation.
International Preliminary Report on Patentability for Application No. PCT/US2013/046902 dated Dec. 22, 2015, 6 pages.
Office Action & Search Report for Taiwan Application No. 104126102 dated May 9, 2016, 6 pages.
Notice of Allowance for Taiwan Patent Application No. 103115368, dated Jul. 9, 2015, 4 pgs.
Office Action for Chinese Patent Application No. 201380076785.4 dated Jan. 29, 2018, 10 pages.
Notice of Allowance for Taiwan Patent Application No. 104126102 dated Sep. 19, 2016, 2 pages.
Notice of Allowance for Taiwan Patent Application No. 105134076 dated Apr. 6, 2017, 4 pages.
Decision to Grant for Great Britain Patent Application No. GB1520166.8 dated May 31, 2018, 2 pgs.
Chinese Patent Application No. 201380076785.4 dated Oct. 19, 2018, 8 pgs.
Office Action from Chinese Patent Application No. 201380076785.4, dated Feb. 2, 2019, 6 pgs.

* cited by examiner

NON-PLANAR SEMICONDUCTOR DEVICE HAVING DOPED SUB-FIN REGION AND METHOD TO FABRICATE SAME

CLAIM OF PRIORITY

This application is a Continuation of U.S. patent application Ser. No. 14/779,936, filed Sep. 24, 2015, which is a National Phase application under 35 U.S.C. § 371 of International Application No. PCT/US2013/046902, filed Jun. 20, 2013, entitled "NON-PLANAR SEMICONDUCTOR DEVICE HAVING DOPED SUB-FIN REGION AND METHOD TO FABRICATE SAME," the entire contents of which are incorporated herein by reference.

TECHNICAL FIELD

Embodiments of the invention are in the field of semiconductor devices and processing and, in particular, non-planar semiconductor devices having doped sub-fin regions and methods of fabricating non-planar semiconductor devices having doped sub-fin regions.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and compatibility with the existing high-yielding bulk silicon substrate infrastructure.

Scaling multi-gate transistors has not been without consequence, however. As the dimensions of these fundamental building blocks of microelectronic circuitry are reduced and as the sheer number of fundamental building blocks fabricated in a given region is increased, the constraints on the semiconductor processes used to fabricate these building blocks have become overwhelming.

BRIEF DESCRIPTION OF THE DRAWINGS

FIG. 1A illustrates a bulk semiconductor substrate having fins etched therein;

FIG. 1B illustrates a P-type solid state dopant source layer formed on the structure of FIG. 1A;

FIG. 1C illustrates a patterned mask formed over only a portion of the fins of FIG. 1B;

FIG. 1D illustrates patterning of the P-type solid state dopant source layer 108 to form a patterned P-type solid state dopant source layer;

FIG. 1E illustrates formation of an insulating buffer layer or blocking layer conformal to the exposed fins and the patterned P-type solid state dopant source layer of FIG. 1D;

FIG. 1F illustrates formation and planarization of a dielectric fill layer over the structure of FIG. 1E to expose the top surfaces of the fins;

FIG. 1G illustrates masking of fins dedicated for NMOS device fabrication along with well and/or retrograde implant operations to form N-type doped fins from exposed PMOS-dedicated fins;

FIG. 1H illustrates recessing of the dielectric fill layer, the patterned P-type solid state dopant source layer and the insulating buffer layer or blocking layer to expose protruding portions of the fins of FIG. 1G; and FIG. 1I illustrates a drive-in anneal to provide doped sub-fin regions of the fins dedicated to NMOS devices.

FIG. 2A illustrates a bulk semiconductor substrate having fins etched therein;

FIG. 2B illustrates a P-type solid state dopant source layer formed on the structure of FIG. 2A and formation of an insulating buffer layer or blocking layer conformal the P-type solid state dopant source layer;

FIG. 2C illustrates a patterned mask formed over only a portion of the fins of FIG. 2B and patterning of the insulating buffer layer or blocking layer and the P-type solid state dopant source layer;

FIG. 2D illustrates formation of an N-type solid state dopant source layer formed on the exposed fins and patterned insulating buffer layer or blocking layer and the patterned P-type solid state dopant source layer of FIG. 2C;

FIG. 2E illustrates a patterned mask formed over only a portion of the fins of FIG. 2D and patterning of the N-type solid state dopant source layer;

FIG. 2F illustrates formation of an insulating buffer layer or blocking layer conformal the N-type solid state dopant source layer;

FIG. 2G illustrates formation a dielectric fill layer over the structure of FIG. 2F;

FIG. 2H illustrates planarization and recessing of the dielectric fill layer, the patterned P-type solid state dopant source layer, the patterned N-type solid state dopant source layer and the insulating buffer layers or blocking layers to expose protruding portions of the fins of FIG. 2G; and FIG. 2I illustrates a drive-in anneal to provide doped sub-fin regions of the fins dedicated to both NMOS and PMOS devices.

DESCRIPTION OF THE EMBODIMENTS

Figure 1A:
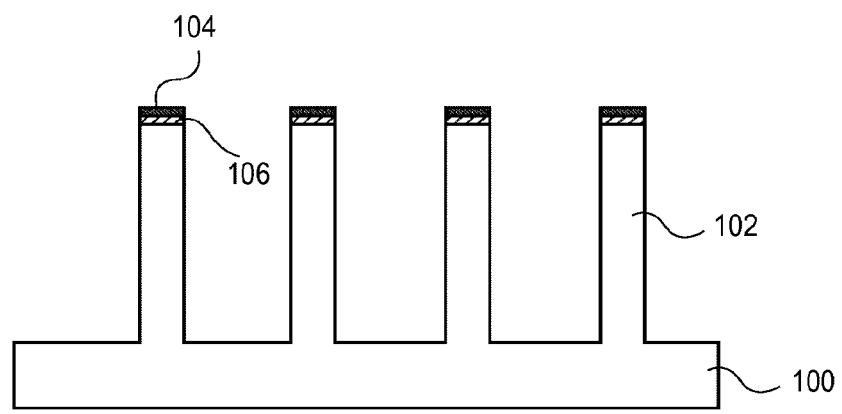
FIGS. 1A-1I illustrate cross-sectional view of various operations in a method of fabricating non-planar semiconductor devices having doped sub-fin regions, in accordance with an embodiment of the present invention, where.

Non-planar semiconductor devices having doped sub-fin regions and methods of fabricating non-planar semiconductor devices having doped sub-fin regions are described. In the following description, numerous specific details are set forth, such as specific integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments described herein is directed to a process to selectively dope sub-fin regions of tri-gate or FinFET transistors fabricated on bulk silicon wafers, e.g., by way of tri-gate doped glass subfin out-diffusion. For example, described herein is a process to selectively dope a sub-fin region of tri-gate or FinFET transistors to mitigate sub-fin leakage while simultaneously keeping fin doping low. Incorporation of a solid state doping sources (e.g., p-type and n-type doped oxides, nitrides or carbides) into the transistor process flow, which after being recessed from the fin sidewalls, delivers well doping into the sub-fin region while keeping the fin body relatively undoped. Additionally, in an embodiment, one or more approaches described herein enables self-alignment of the bottom of an active portion of a bulk fin with a doping boundary between the active portion and the remaining bulk portion (e.g., the portion below the gate-controlled region).

More generally, it may be desirable to use bulk silicon for fins or trigate. However, there is a concern that regions (sub-fin) below the active silicon fin portion of the device (e.g., the gate-controlled region, or HSi) is under diminished or no gate control. As such, if source or drain regions are at or below the HSi point, then leakage pathways may exist through the subfin region. In accordance with an embodiment of the present invention, in order to address the above issues, sufficient doping is provided through subfin doping without necessarily delivering the same level of doping to the HSi portions of the fins.

Embodiments may include one or more of the following features or considerations: (1) low doped fins with high doped sub-fin regions; (2) the use of boron doped oxide (e.g., BSG) as a dopant source for NMOS sub-fin regions; (3) the use of phosphorous doped oxide (e.g., PSG) or arsenic doped oxide (e.g., AsSG) as a dopant source for PMOS sub-fin regions; (4) low-doped NMOS fin/BSG doped subfin plus standard implanted PMOS fin (e.g., involving a patterning process to remove boron doped oxide from PMOS structures, while NMOS well doping is subsequently delivered by a boron doped layer, and PMOS well doping is achieved by conventional implant processes); (5) low-doped PMOS fin/PSG or AsSG doped sub-fin plus standard implanted NMOS fin (e.g., involving a patterning process to remove phosphorus or arsenic doped oxide from NMOS structures, while PMOS well doping is subsequently delivered by a phosphorus or arsenic doped layer, and NMOS well doping is achieved by conventional implant processes); (6) low-doped PMOS and NMOS fins formed on the same wafer by integration of BSG/(PSG or AsSG) doped sub-fins (e.g., involving a patterning process to integrate NMOS sub-fin regions formed by BSG dopant out-diffusion and PMOS sub-fin regions formed by PSG or AsSG dopant out-diffusion on same wafer). Processes described herein may enable low-doped NMOS and PMOS fin fabrication with high sub-fin doping in both NMOS and PMOS devices. It is to be understood that in place of BSG, PSG or AsSG, more generally, the N-type or P-type solid state dopant source layer is a dielectric layer incorporating N-type or P-type dopants, respectively, therein such as, but not limited to, an N-type or P-type doped oxide, nitride or carbide layer.

To provide context, conventional approaches to addressing the above issues have involved the use of well implant operations, where the sub-fin region is heavily doped (e.g., much greater than $2E18/cm^3$), which shuts off sub-fin leakage but leads to substantial doping in the fin as well. The addition of halo implants further increases fin doping such that end of line fins are doped at a high level (e.g., greater than approximately $1E18/cm^3$). By contrast, one or more embodiments described herein provide low doping in the fin which may be beneficial since higher current drive is enabled by improving carrier mobility, which is otherwise degraded by ionized impurity scattering for high doped channel devices. Furthermore, since random variation of threshold voltage (Vt) is directly proportional to the square root of doping density, low doped devices also have the advantage of lowering the random mismatch in Vt. This enables products to operate at lower voltages without functional failures. At the same time, the region just below the fin (i.e. the sub-fin) must be highly doped in order to prevent sub-fin source-drain leakage. Conventional implant steps used to deliver this doping to the sub-fin region also dope the fin region substantially, making it impossible to achieve low doped fins and suppress sub-fin leakage at same time.

As described more thoroughly below, one or embodiments described herein may include use of a solid source doping layer (e.g. boron doped oxide) deposited on fins subsequent to fin etch. Later, after trench fill and polish, the doping layer is recessed along with the trench fill material to define the fin height (Hsi) for the device. The operation removes the doping layer from the fin sidewalls above Hsi. Therefore, the doping layer is present only along the fin sidewalls in the sub-fin region which ensures precise control of doping placement. After a drive-in anneal, high doping is limited to the sub-fin region, quickly transitioning to low doping in the adjacent region of the fin above Hsi (which forms the channel region of the transistor). One or more advantages or implementations include: (1) use of solid source doping layer; (2) patterning to remove doping layer from opposite polarity devices; (3) etch operation that recesses trench material and doping layer in one operation; (4) improved transistor current drive and improved random Vt mismatch; (5) possibility of removing well implants from a device flow altogether (in such a case, the use of solid state doping provides inter-transistor isolation and, hence, separate well formation may no longer be necessary).

In a first example, FIGS. 1A-1I illustrate cross-sectional view of various operations in a method of fabricating non-planar semiconductor devices having doped sub-fin regions, in accordance with an embodiment of the present invention. The first exemplary process flow may be described, in one specific embodiment, as a borosilicate glass (BSG) NMOS and implanted PMOS fabrication scheme.

Referring to FIG. 1A, a bulk semiconductor substrate 100, such as a bulk single crystalline silicon substrate is provided having fins 102 etched therein. In an embodiment, the fins are formed directly in the bulk substrate 100 and, as such, are formed continuous with the bulk substrate 100. Artifacts remaining from the fabrication of fins 102 may also be present. For example, as depicted in FIG. 1A, a hardmask layer 104, such as a silicon nitride hardmask layer, and a pad oxide layer 106, such as a silicon dioxide layer, remain atop fins 102. In one embodiment, the bulk substrate 100 and, hence, the fins 102, are undoped or lightly doped at this stage. For example, in a particular embodiment, the bulk substrate 100 and, hence, the fins 102, have a concentration of less than approximately 1E17 atoms/cm$^3$ of boron dopant impurity atoms.

Figure 1B:
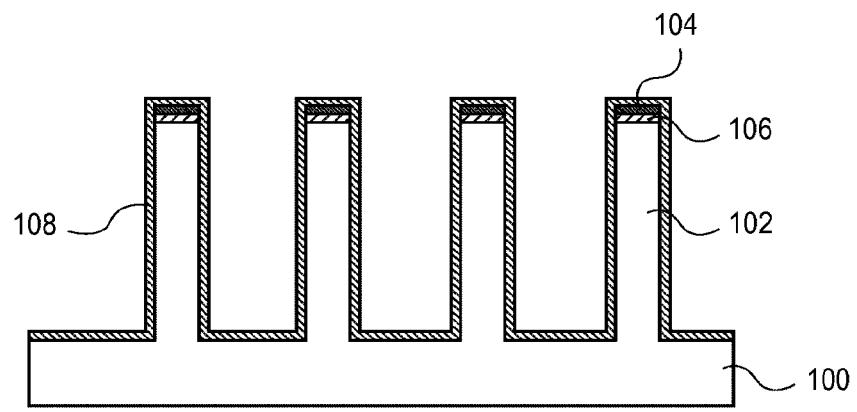

Referring to FIG. 1B, a P-type solid state dopant source layer 108 is formed on the structure of FIG. 1A. In one embodiment, the P-type solid state dopant source layer 108 is a dielectric layer incorporating P-type dopants therein such as, but not limited to, a P-type doped oxide, nitride or carbide layer. In a specific such embodiment, the P-type solid state dopant source layer 108 is a borosilicate glass layer. The P-type solid state dopant source layer 108 may be formed by a process suitable to provide a conformal layer on the fins 102. For example, in one embodiment, the P-type solid state dopant source layer 108 is formed by a chemical vapor deposition (CVD) process or other deposition process (e.g., ALD, PECVD, PVD, HDP assisted CVD, low temp CVD) as a conformal layer above the entire structure of FIG. 1A. In a particular embodiment, the P-type solid state dopant source layer 108 is a BSG layer having a boron concentration approximately in the range of 0.1-10 weight %. In another embodiment, a capping layer can be formed on the P-type solid state dopant source layer 108 as an in situ-formed capping layer to protect the P-type solid state dopant source layer 108 during subsequent exposure to ambient conditions. In one such embodiment, the capping layer is a nitride, carbide or alumina ($Al_2O_3$) capping layer. It is to be understood that the capping layer can be patterned in a same patterning operation, if any, as used for the P-type solid state dopant source layer 108.

Figure 1C:
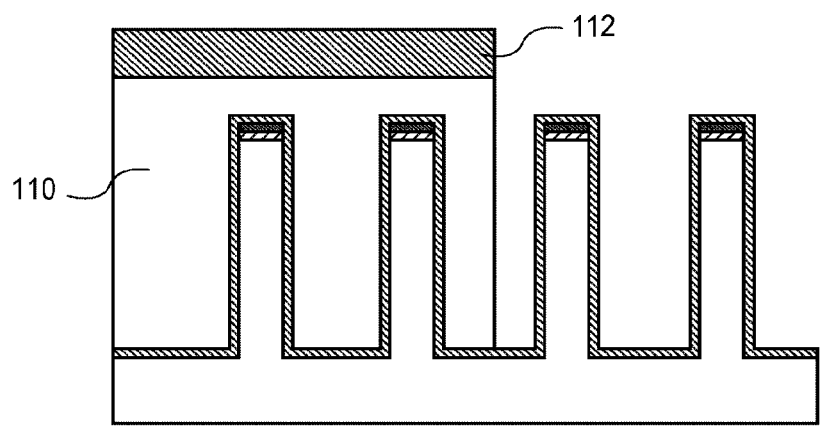

Referring to FIG. 1C, a patterned mask is formed over only a portion of the fins 102. As will be described in association with subsequent processing operations, this masking operation enables distinction between fins for NMOS devices and fins for PMOS devices. In one embodiment, the mask is composed of a topographic masking portion 110 and an anti-reflective coating (ARC) layer 112. In a particular such embodiment, the topographic masking portion 110 is a carbon hardmask (CHM) layer and the anti-reflective coating layer 112 is a silicon ARC layer. The topographic masking portion 110 and the ARC layer 112 may be patterned with conventional lithography and etching process techniques.

Figure 1D:
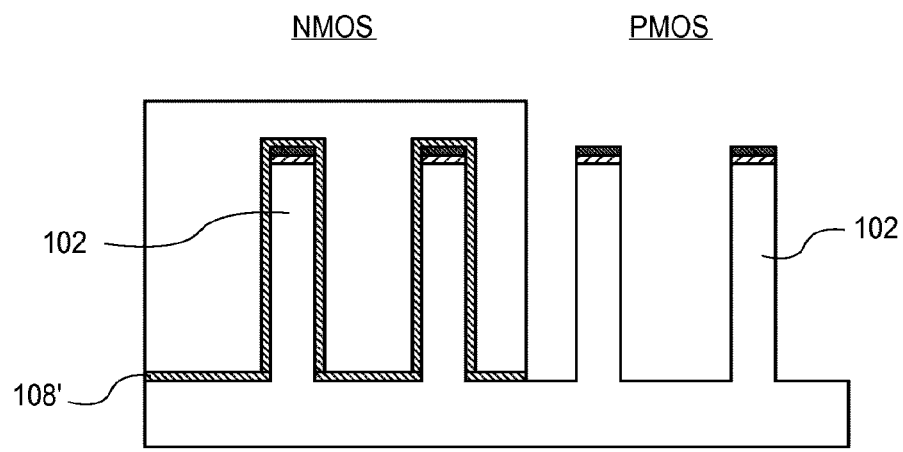

Referring to FIG. 1D and on, designations of fins 102 as suitable for an NMOS or a PMOS device are indicated from this point on in the process flow. Referring to FIG. 1D specifically, the P-type solid state dopant source layer 108 is patterned, e.g., by a plasma, vapor or wet etch process, to form patterned P-type solid state dopant source layer 108'. Also depicted is the removal of the anti-reflective coating layer 112 which may also be performed using a plasma, vapor or wet etch process. Patterning of the P-type solid state dopant source layer 108 and removal of the anti-reflective coating layer 112 may be performed in a same or different processing operation.

Figure 1E:
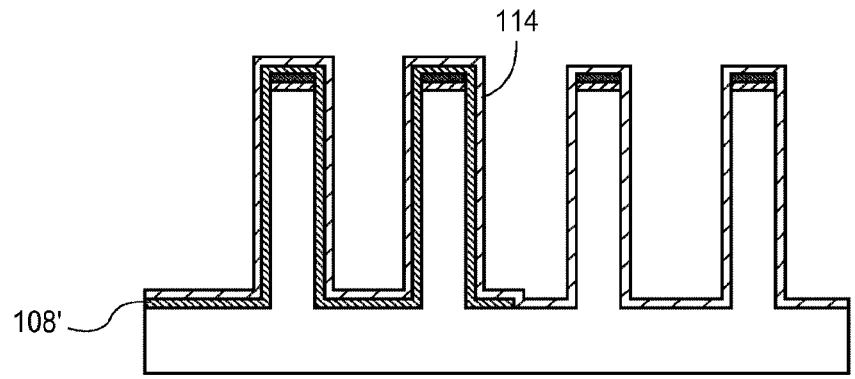

Referring to FIG. 1E, topographic masking portion 110 is removed which may be performed using a plasma, vapor or wet etch process. Removal of the topographic masking portion 110 may be performed in a same process operation as the removal of the anti-reflective coating layer 112, or in a subsequent process operation. Also depicted in FIG. 1E, an insulating buffer layer or blocking layer 114, such as an isolation nitride layer, is formed conformal to the exposed fins 102 and the patterned P-type solid state dopant source layer 108', e.g., to cap the patterned P-type solid state dopant source layer 108'. The insulating buffer layer or blocking layer 114 may be formed by a process suitable to provide a conformal layer on the exposed fins 102 and the patterned P-type solid state dopant source layer 108'. For example, in one embodiment, the insulating buffer layer or blocking layer 114 is formed by a chemical vapor deposition (CVD) process or other deposition process (e.g., ALD, PECVD, PVD, HDP assisted CVD, low temp CVD).

Figure 1F:
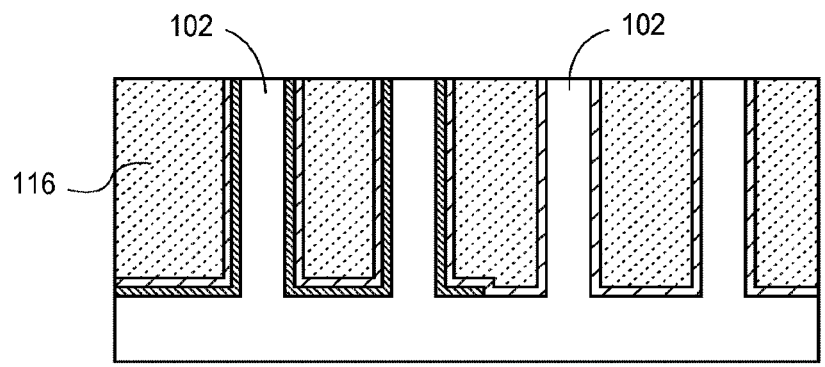

Referring to FIG. 1F, a dielectric fill layer 116 is formed over the structure of FIG. 1E and subsequently planarized to expose the top surfaces of the fins 102 (e.g., exposing both NMOS and PMOS dedicated fins 102). In one embodiment, the dielectric fill layer 116 is composed of silicon dioxide, such as is used in a shallow trench isolation fabrication process. The dielectric fill layer 116 may be deposited by a chemical vapor deposition (CVD) or other deposition process (e.g., ALD, PECVD, PVD, HDP assisted CVD, low temp CVD) and may be planarized by chemical mechanical polishing (CMP) techniques. The planarization also removes portions of the patterned P-type solid state dopant source layer 108', and the insulating buffer layer or blocking layer 114 if present, from the top of fins 102. As is also depicted in FIG. 1F, any artifacts from fin patterning, such as the hardmask layer 104 and the pad oxide layer 106, may be removed during the CMP process to expose fins 102. In an alternative embodiment, a hardmask or other dielectric layer may be retained on top of the fins in order to eliminate or reduce gate control from the top of the fins (e.g., as in a double gate device versus a tri-gate device).

Figure 1G:
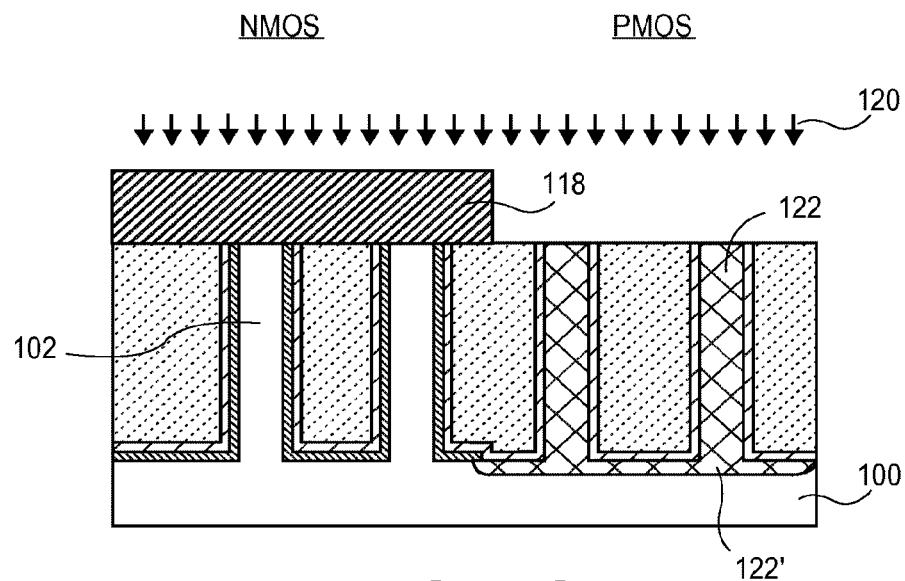

Referring to FIG. 1G, the fins 102 dedicated for NMOS device fabrication are masked by a masking layer 118. In one embodiment, the masking layer 118 is composed of a photo-resist layer, as is known in the art, and may be patterned by conventional lithography and development processes. In a particular embodiment, the portions of the photo-resist layer exposed to the light source are removed upon developing the photo-resist layer. Thus, patterned photo-resist layer is composed of a positive photo-resist material. In a specific embodiment, the photo-resist layer is composed of a positive photo-resist material such as, but not limited to, a 248 nm resist, a 193 nm resist, a 157 nm resist, an extreme ultra violet (EUV) resist, an e-beam imprint layer, or a phenolic resin matrix with a diazonaphthoquinone sensitizer. In another particular embodiment, the portions of the photo-resist layer exposed to the light source are retained upon developing the photo-resist layer. Thus, the photo-resist layer is composed of a negative photo-resist material. In a specific embodiment, the photo-resist layer is composed of a negative photo-resist material such as, but not limited to, consisting of poly-cis-isoprene or poly-vinyl-cinnamate.

Additionally, referring again to FIG. 1G, well and/or retrograde implant operations 120 are performed to form N-type doped fins 122 from the exposed PMOS-dedicated fins. The doping of the exposed finds may lead to doping within the bulk substrate portion 100, where adjacent fins 122 share a common doped region 122' in the bulk substrate 100. In one embodiment, the N-type doped fins 122, and the common doped region 122' if present, are doped to include phosphorous and/or arsenic N-Type dopants having a total concentration of 2E18 atoms/cm$^3$ or greater.

Figure 1H:
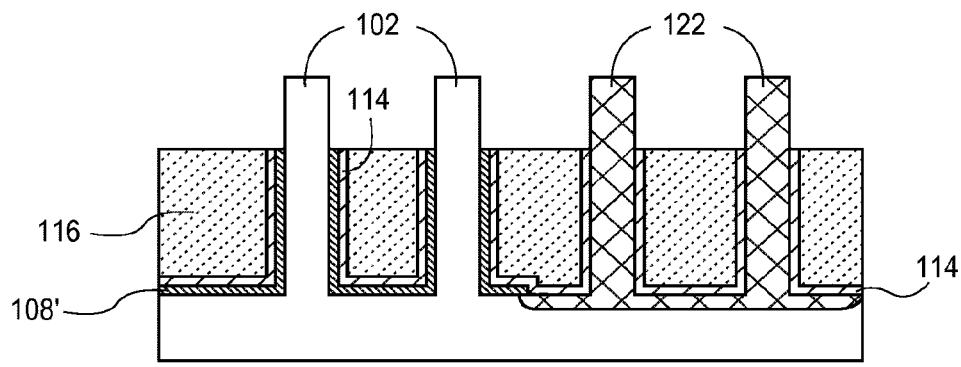

Referring to FIG. 1H, the dielectric fill layer 116 is recessed to expose protruding portions of fins 102 and 122. Additionally, the patterned P-type solid state dopant source layer 108', and the insulating buffer layer or blocking layer 114 if present, are recessed to approximately the same level as the dielectric fill layer 116, as depicted in FIG. 1H. The recessing of these layers may be performed by a plasma, vapor or wet etch process. In one embodiment, a dry etch process selective to silicon fins is used, the dry etch process based on a plasma generated from gases such as, but not limited to $NF_3$, $CHF_3$, $C_4F_8$, HBr and $O_2$ with typically pressures in the range of 30-100 mTorr and a plasma bias of 50-1000 Watts. In an embodiment, the dielectric fill layer 116 and the patterned P-type solid state dopant source layer 108' are recessed at the same time at an approximately 1:1 selectivity. In another embodiment, the dielectric fill layer 116 and the patterned P-type solid state dopant source layer 108' are recessed sequentially.

Figure 1I:
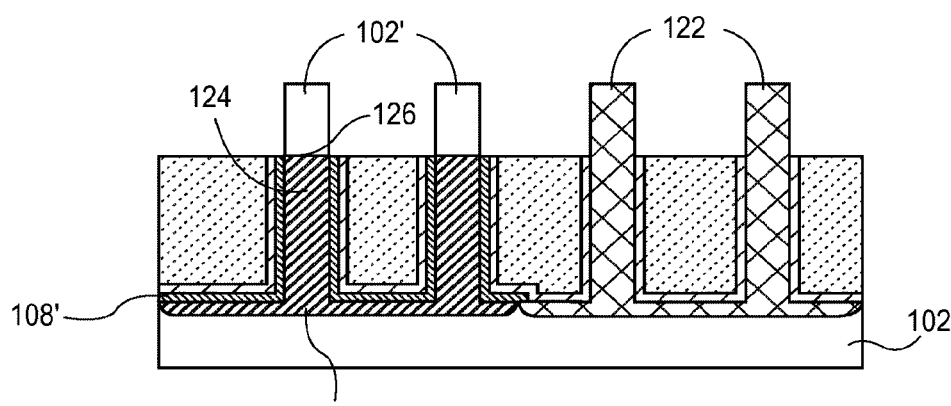

Referring to FIG. 1I, a drive-in anneal is performed to provide doped sub-fin regions of the fins dedicated to NMOS devices. More particularly, upon heating, dopants from the patterned P-type solid state dopant source layer 108', such as boron dopant atoms, are diffused into the sub-fin regions (those regions below the recessed dielectric fill layer 116) to form P-type doped sub-fin regions 124. The diffusion may also lead to doping within the bulk substrate portion 100, where adjacent fins 102 share a common doped region 124' in the bulk substrate 100. In this manner, the protruding portions of fins 102, e.g., protruding portions 102', of the NMOS devices remain undoped or lightly doped, e.g., essentially retaining the doping profile of the original bulk substrate 100 and fins 102 described in association with FIG. 1A. As a result, an interface 126 exists between the protruding portions 102' and the P-type doped sub-fin regions 124. In one such embodiment, the interface 126 represents a doping concentration step or rapid gradient change where the P-type doped sub-fin regions 124 have a total dopant concentration of 2E18 atoms/cm$^3$ or greater, while the protruding portions 102' have a total dopant concentration significantly less than 2E18 atoms/cm$^3$, e.g., of approximately 5E17 atoms/cm$^3$ or less. The transition region can be relatively abrupt, as is described in greater detail below in association with FIGS. 4A and 4B.

Referring again to FIG. 1I, the P-type doped sub-fin regions 124 are doped across the entire sub-fin region. In one such embodiment, each fin is approximately 10 nanometers wide, and the dopant drive-in process of FIG. 1G requires only a 5 nanometer drive of dopants from each side of the patterned P-type solid state dopant source layer 108'. In an embodiment, the drive-in operation is performed at a temperature approximately in the range of 800-1050 degrees Celsius.

In general, referring again to FIGS. 1A-1I, in an embodiment, a doping layer of borosilicate glass (BSG) is used to dope sub-fin regions of NMOS devices. A layer of BSG is deposited on fins after fin etch. The wafers are patterned such that the BSG is removed from the PMOS regions. A blocking or a barrier layer may be deposited to form a barrier between the BSG and trench fill (dielectric 116) material to enable robust boron in-diffusion from the BSG film into the silicon sub-fin. After trench fill and polish, PMOS fins are doped with standard well implants. The trench fill recess operation removes BSG from the fin protrusions on the NMOS fins. Finally, a drive-in anneal operation drives boron doping into the sub-fin while leaving the protruding portion of the fin without significant doping. It is to be understood that, in another embodiment, the conductivity types described in association with FIGS. 1A-1I can be reversed, e.g., N-type for P-type and vice versa.

In another aspect, a solid state doping source may be used to dope subfin regions for both NMOS and PMOS device fabrication. Thus, in a second example, FIGS. 2A-2I illustrate cross-sectional view of various operations in another method of fabricating non-planar semiconductor devices having doped sub-fin regions, in accordance with an embodiment of the present invention. The second exemplary process flow may be described, in one specific embodiment, as a borosilicate glass (BSG) NMOS and phosphosilicate glass (PSG) or arsenic-silicate glass (AsSG) PMOS fabrication scheme.

Figure 2A:
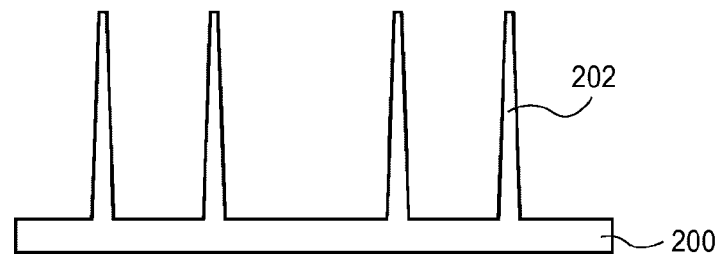
FIGS. 2A-2I illustrate cross-sectional view of various operations in another method of fabricating non-planar semiconductor devices having doped sub-fin regions, in accordance with an embodiment of the present invention where.

Referring to FIG. 2A, a bulk semiconductor substrate 200, such as a bulk single crystalline silicon substrate is provided having fins 202 etched therein. In an embodiment, the fins are formed directly in the bulk substrate 200 and, as such, are formed continuous with the bulk substrate 200. Artifacts remaining from the fabrication of fins 202 (e.g., a silicon nitride hardmask layer and underlying pad oxide layer) may already be removed at this stage, as depicted in FIG. 2A. Alternatively, a hardmask layer, such as a silicon nitride hardmask layer, and a pad oxide layer, such as a silicon dioxide layer, may remain atop the fins, as was described in association with FIG. 1A. In one embodiment, the bulk substrate 200 and, hence, the fins 202, are undoped or lightly doped at this stage. For example, in a particular embodiment, the bulk substrate 200 and, hence, the fins 202, have a concentration of less than approximately 5E17 atoms/cm$^3$ of boron dopant impurity atoms.

Figure 2B:
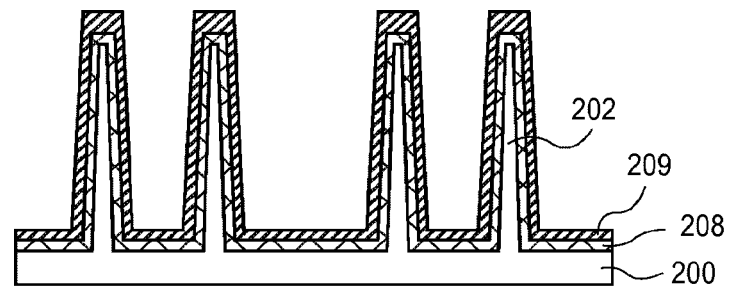

Referring to FIG. 2B, a P-type solid state dopant source layer 208 is formed on the structure of FIG. 2A. In one embodiment, the P-type solid state dopant source layer 208 is a dielectric layer incorporating P-type dopants therein such as, but not limited to, a P-type doped oxide, nitride or carbide layer. In a specific such embodiment, the P-type solid state dopant source layer 208 is a borosilicate glass layer. The P-type solid state dopant source layer 208 may be formed by a process suitable to provide a conformal layer on the fins 202. For example, in one embodiment, the P-type solid state dopant source layer 208 is formed by a chemical vapor deposition (CVD) process or other deposition process (e.g., ALD, PECVD, PVD, HDP assisted CVD, low temp CVD) as a conformal layer above the entire structure of FIG. 2A. In a particular embodiment, the P-type solid state dopant source layer 208 is a BSG layer having a boron concentration approximately in the range of 0.1-10 weight %. In another embodiment, a capping layer can be formed on the P-type solid state dopant source layer 208 as an in situ-formed capping layer to protect the P-type solid state dopant source layer 208 during subsequent exposure to ambient conditions. In one such embodiment, the capping layer is a nitride, carbide or alumina ($Al_2O_3$) capping layer. It is to be understood that the capping layer can be patterned in a same patterning operation, if any, as used for the P-type solid state dopant source layer 208.

Referring again to FIG. 2B, an insulating buffer layer or blocking layer 209, such as an isolation nitride layer, is formed conformal to the P-type solid state dopant source layer 208, e.g., to cap the P-type solid state dopant source layer 208. The insulating buffer layer or blocking layer 209 may be formed by a process suitable to provide a conformal layer on the P-type solid state dopant source layer 208. For example, in one embodiment, the insulating buffer layer or blocking layer 209 is formed by a chemical vapor deposition (CVD) process or other deposition process (e.g., ALD, PECVD, PVD, HDP assisted CVD, low temp CVD).

Figure 2C:
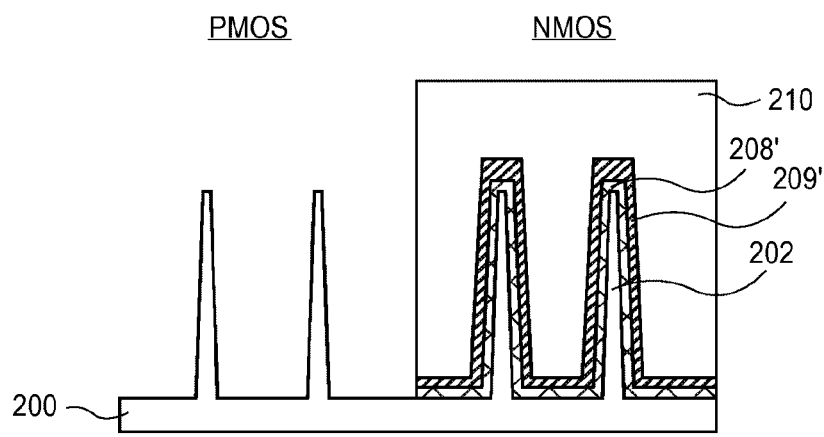

Referring to FIG. 2C and on, designations of fins 202 as suitable for an NMOS or a PMOS device are indicated from this point on in the process flow. Referring to FIG. 2C specifically, a patterned mask is formed over only a portion of the fins 202. As will be described in association with subsequent processing operations, this masking operation enables distinction between fins for NMOS devices and fins for PMOS devices. In one embodiment, the mask is composed of a topographic masking portion 210 and, possibly, an anti-reflective coating (ARC) layer (not shown). In a particular such embodiment, the topographic masking portion 210 is a carbon hardmask (CHM) layer and the anti-reflective coating layer is a silicon ARC layer. The topographic masking portion 210 and the ARC layer may be patterned with conventional lithography and etching process techniques. Referring again to FIG. 2C, the insulating buffer layer or blocking layer 209 the P-type solid state dopant source layer 208 are patterned, e.g., by a plasma, vapor or wet etch process, to form patterned insulating buffer layer or blocking layer 209' and patterned P-type solid state dopant source layer 208', respectively.

Figure 2D:
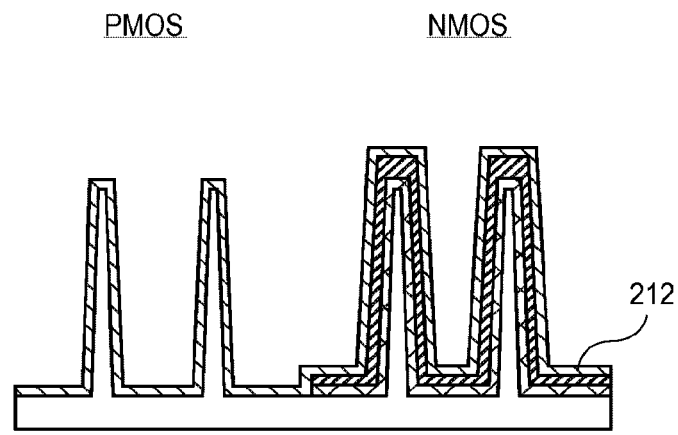

Referring to FIG. 2D, topographic masking portion 210 is removed which may be performed using a plasma, vapor or wet etch process. Also depicted in FIG. 2D, an N-type solid state dopant source layer 212 is formed conformal to the exposed fins and conformal to the patterned insulating buffer layer or blocking layer 209' and patterned P-type solid state dopant source layer 208'. In one embodiment, the N-type solid state dopant source layer 212 is a dielectric layer incorporating N-type dopants therein such as, but not limited to, an N-type doped oxide, nitride or carbide layer. In a specific such embodiment, the N-type solid state dopant source layer 212 is a phosphosilicate glass layer or an arsenic silicate glass layer. The N-type solid state dopant source layer 212 may be formed by a process suitable to provide a conformal layer on the exposed fins and the patterned insulating buffer layer or blocking layer 209' and patterned P-type solid state dopant source layer 208'. For example, in one embodiment, the N-type solid state dopant source layer 212 is formed by a chemical vapor deposition (CVD) process or other deposition process (e.g., ALD, PECVD, PVD, HDP assisted CVD, low temp CVD) as a conformal layer above the entire structure of FIG. 2C (having 210 removed there from). In a particular embodiment, the N-type solid state dopant source layer 212 is a PSG layer or an AsSG layer having a phosphorous or arsenic, respectively, concentration approximately in the range of 0.1-10 weight %. In another embodiment, a capping layer can be formed on the N-type solid state dopant source layer 212 as an in situ-formed capping layer to protect the N-type solid state dopant source layer 212 during subsequent exposure to ambient conditions. In one such embodiment, the capping layer is a nitride, carbide or alumina ($Al_2O_3$) capping layer. It is to be understood that the capping layer can be patterned in a same patterning operation, if any, as used for the N-type solid state dopant source layer 212.

Figure 2E:
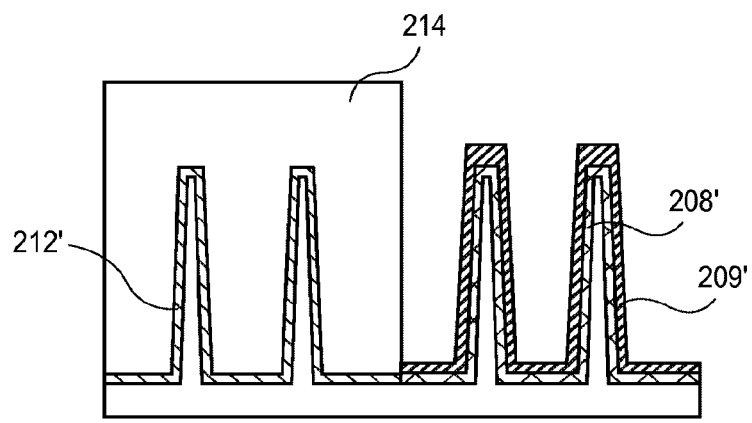

Referring to FIG. 2E, a patterned mask is formed over only a portion of the fins. As will be described in association with subsequent processing operations, this masking operation further enables distinction between fins for NMOS devices and fins for PMOS devices. In one embodiment, the mask is composed of a topographic masking portion 214 and, possibly, an anti-reflective coating (ARC) layer (not shown). In a particular such embodiment, the topographic masking portion 214 is a carbon hardmask (CHM) layer and the anti-reflective coating layer is a silicon ARC layer. The topographic masking portion 214 and the ARC layer may be patterned with conventional lithography and etching process techniques. Referring again to FIG. 2E, the N-type solid state dopant source layer 212 is patterned, e.g., by a plasma, vapor or wet etch process, to form patterned N-type solid state dopant source layer 212'.

In an alternative embodiment, the masking operations described in association with FIG. 2E is eliminated from the process flow, reducing the total number of masking operations needed. In one such embodiment, then, the N-type solid state dopant source layer 212 is not patterned and is retained in both NMOS and PMOS locations. The patterned insulating buffer layer or blocking layer 209' inhibits dopants from such a non-patterned N-type solid state dopant source layer 212 from entering sub-fin regions in locations where the patterned P-type solid state dopant source layer 208' is intended as the doping source.

Figure 2F:
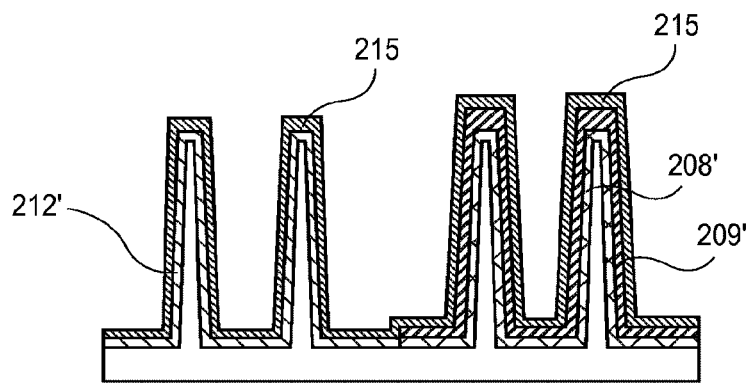

Referring to FIG. 2F, topographic masking portion 214 is removed which may be performed using a plasma, vapor or wet etch process. Also depicted in FIG. 2F, an insulating buffer layer or blocking layer 215, such as an isolation nitride layer, is formed conformal to the patterned N-type solid state dopant source layer 212' and to the patterned insulating buffer layer or blocking layer 209', e.g., to cap the patterned N-type solid state dopant source layer 212'. The insulating buffer layer or blocking layer 215 may be formed by a process suitable to provide a conformal layer. For example, in one embodiment, the insulating buffer layer or blocking layer 215 is formed by a chemical vapor deposition (CVD) process or other deposition process (e.g., ALD, PECVD, PVD, HDP assisted CVD, low temp CVD). The insulating buffer layer or blocking layer 215 may be deposited whether or not the N-type solid state dopant source layer 212 is patterned.

Figure 2G:
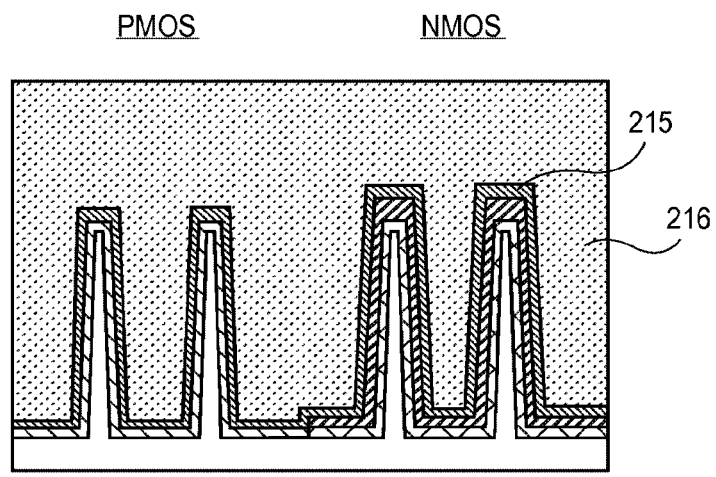

Referring to FIG. 2G, a dielectric fill layer 216 is formed over the structure of FIG. 2F. In one embodiment, the dielectric fill layer 216 is composed of silicon dioxide, such as is used in a shallow trench isolation fabrication process. The dielectric fill layer 216 may be deposited by a chemical vapor deposition (CVD) or other deposition process (e.g., ALD, PECVD, PVD, HDP assisted CVD, low temp CVD).

Figure 2H:
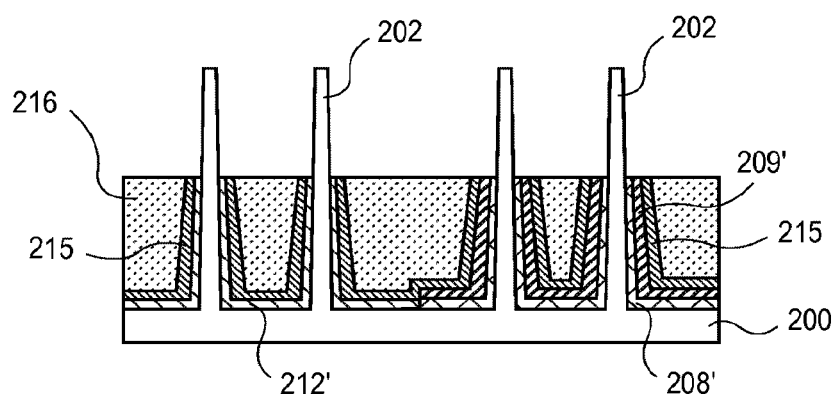

Referring to FIG. 2H, the dielectric fill layer 216 is subsequently planarized to expose the top surfaces of the fins 202 (e.g., exposing both NMOS and PMOS dedicated fins 202). The dielectric fill layer 216 may be planarized by chemical mechanical polishing (CMP) techniques. The planarization also removes portions of the patterned P-type solid state dopant source layer 208', the patterned N-type solid state dopant source layer 212', and the insulating buffer layers or blocking layers 209' and 215 if present, from the tops of fins 202. In an alternative embodiment, a hardmask or other dielectric layer may be retained on top of the fins in order to eliminate or reduce gate control from the top of the fins (e.g., as in a double gate device versus a tri-gate device).

Referring again to FIG. 2H, the dielectric fill layer 216 is recessed to expose protruding portions of fins 202. Additionally, the patterned P-type solid state dopant source layer 208', the patterned N-type solid state dopant source layer 212', and the insulating buffer layers or blocking layers 209' and 215 if present, are recessed to approximately the same level as the dielectric fill layer 216, as depicted in FIG. 2H. The recessing of these layers may be performed by a plasma, vapor or wet etch process. In one embodiment, a dry etch process selective to silicon fins is used, the dry etch process based on a plasma generated from gases such as, but not limited to $NF_3$, $CHF_3$, $C_4F_8$, HBr and $O_2$ with typically pressures in the range of 30-100 mTorr and a plasma bias of 50-1000 Watts.

Figure 2I:
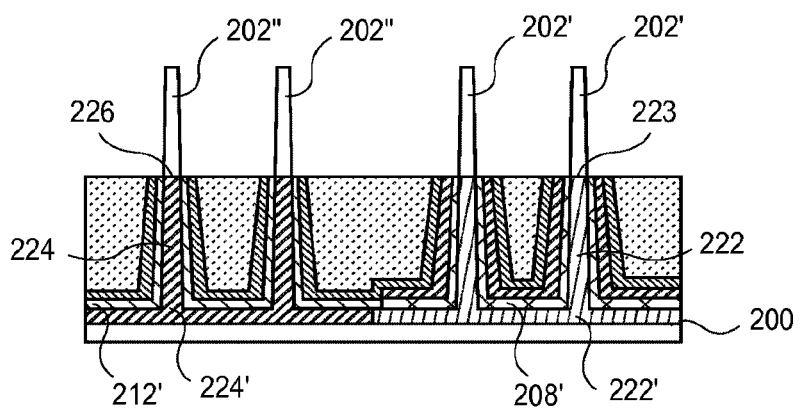

Referring to FIG. 2I, a drive-in anneal is performed to provide doped sub-fin regions of the fins dedicated to both NMOS and PMOS devices. More particularly, upon heating, dopants from the patterned P-type solid state dopant source layer 208', such as boron dopant atoms, are diffused into the sub-fin regions (those regions below the recessed dielectric fill layer 216) to form P-type doped sub-fin regions 222. The diffusion may also lead to doping within the bulk substrate portion 200, where adjacent fins 202' share a common doped region 222' in the bulk substrate 200. In this manner, the protruding portions of fins 202' of the NMOS devices remain undoped or lightly doped, e.g., essentially retaining the doping profile of the original bulk substrate 200 and fins 202 described in association with FIG. 2A. As a result, an interface 223 exists between the protruding portions 202' and the P-type doped sub-fin regions 222. In one such embodiment, the interface 223 represents a doping concentration step or rapid gradient change where the P-type doped sub-fin regions 222 have a total dopant concentration of 2E18 atoms/cm$^3$ or greater, while the protruding portions 202' have a total dopant concentration significantly less than 2E18 atoms/cm$^3$, e.g., of approximately 5E17 atoms/cm$^3$ or less. The transition region can be relatively abrupt, as is described in greater detail below in association with FIGS. 4A and 4B.

Additionally, upon the heating, dopants from the patterned N-type solid state dopant source layer 212', such as phosphorous or arsenic dopant atoms, are diffused into the sub-fin regions (those regions below the recessed dielectric fill layer 216) to form N-type doped sub-fin regions 224. The diffusion may also lead to doping within the bulk substrate portion 200, where adjacent fins 202" share a common doped region 224' in the bulk substrate 200. In this manner, the protruding portions of fins 202" of the PMOS devices remain undoped or lightly doped, e.g., essentially retaining the doping profile of the original bulk substrate 200 and fins 202 described in association with FIG. 2A. As a result, an interface 226 exists between the protruding portions 222" and the N-type doped sub-fin regions 224. In one such embodiment, the interface 226 represents a doping concentration step or rapid gradient change where the N-type doped sub-fin regions 224 have a total dopant concentration of 2E18 atoms/cm$^3$ or greater, while the protruding portions 222" have a total dopant concentration significantly less than 2E18 atoms/cm$^3$, e.g., of approximately 5E17 atoms/cm$^3$ or less. The transition region can be relatively abrupt, as is described in greater detail below in association with FIGS. 4A and 4B.

Referring again to FIG. 2I, the P-type doped sub-fin regions 222 and the N-type doped sub-fin regions 224 are doped across the respective entire sub-fin regions. In one such embodiment, each fin is approximately 10 nanometers wide, and the dopant drive-in process of FIG. 2G requires only a 5 nanometer drive of dopants from each side of the respective patterned P-type solid state dopant source layer 208' or patterned N-type solid state dopant source layer 212'. In an embodiment, the drive-in operation is performed at a temperature approximately in the range of 800-1050 degrees Celsius.

In general, referring again to FIGS. 2A-2I, in an embodiment, borosilicate glass (BSG) is implemented for NMOS fin doping, while a phosphosilicate (PSG) or arsenic-silicate glass (AsSG) layer is implemented for PMOS fin doping. It is to be understood that, in another embodiment, the conductivity types described in association with FIGS. 2A-2I can be reversed, e.g., N-type for P-type and vice versa.

It is to be understood that the structures resulting from the above exemplary processing schemes, e.g., structures from FIGS. 1I and 2I, may be used in a same or similar form for subsequent processing operations to complete device fabrication, such as PMOS and NMOS device fabrication. As an example of a completed device, FIGS. 3A and 3B illustrate a cross-sectional view and a plan view (taken along the a-a' axis of the cross-sectional view), respectively, of a non-planar semiconductor device having fins with doped sub-fin regions, in accordance with an embodiment of the present invention.

Figure 3A:
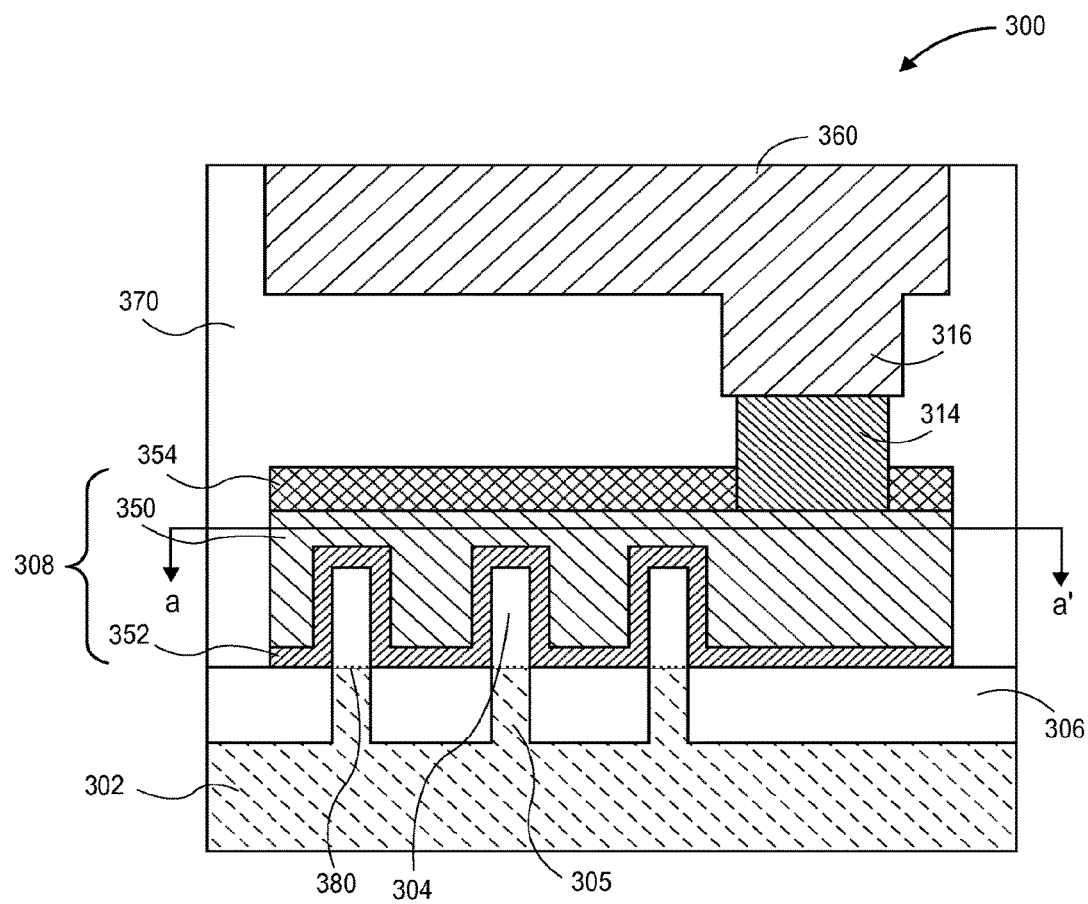
FIG. 3A illustrates a cross-sectional view of a non-planar semiconductor device having fins with doped sub-fin regions, in accordance with an embodiment of the present invention.

Referring to FIG. 3A, a semiconductor structure or device 300 includes a non-planar active region (e.g., a fin structure including protruding fin portion 304 and sub-fin region 305) formed from substrate 302, and within isolation region 306. A gate line 308 is disposed over the protruding portions 304 of the non-planar active region as well as over a portion of the isolation region 306. As shown, gate line 308 includes a gate electrode 350 and a gate dielectric layer 352. In one embodiment, gate line 308 may also include a dielectric cap layer 354. A gate contact 314, and overlying gate contact via 316 are also seen from this perspective, along with an overlying metal interconnect 360, all of which are disposed in inter-layer dielectric stacks or layers 370. Also seen from the perspective of FIG. 3A, the gate contact 314 is, in one embodiment, disposed over isolation region 306, but not over the non-planar active regions. As is also depicted in FIG. 3A, an interface 380 exists between the doping profile of protruding fin portion 304 and sub-fin region 305. The interface 380 can be a transition region that is relatively abrupt, as is described in greater detail below in association with FIGS. 4A and 4B.

Figure 3B:
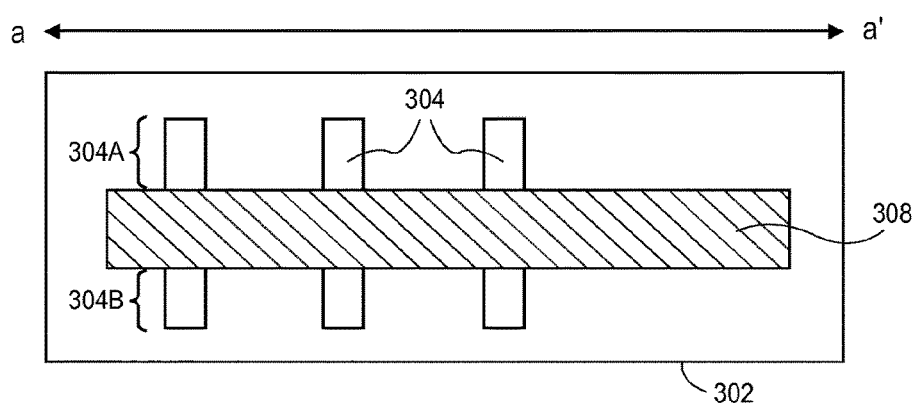
FIG. 3B illustrates a plan view taken along the a-a' axis of the semiconductor device of FIG. 3A, in accordance with an embodiment of the present invention.

Referring to FIG. 3B, the gate line 308 is shown as disposed over the protruding fin portions 304. Source and drain regions 304A and 304B of the protruding fin portions 304 can be seen from this perspective. In one embodiment, the source and drain regions 304A and 304B are doped portions of original material of the protruding fin portions 304. In another embodiment, the material of the protruding fin portions 304 is removed and replaced with another semiconductor material, e.g., by epitaxial deposition. In either case, the source and drain regions 304A and 304B may extend below the height of dielectric layer 306, i.e., into the sub-fin region 305. In accordance with an embodiment of the present invention, the more heavily doped sub-fin regions, i.e., the doped portions of the fins below interface 380, inhibits source to drain leakage through this portion of the bulk semiconductor fins.

In an embodiment, the semiconductor structure or device 300 is a non-planar device such as, but not limited to, a fin-FET or a tri-gate device. In such an embodiment, a corresponding semiconducting channel region is composed of or is formed in a three-dimensional body. In one such embodiment, the gate electrode stacks of gate lines 308 surround at least a top surface and a pair of sidewalls of the three-dimensional body.

Substrate 302 may be composed of a semiconductor material that can withstand a manufacturing process and in which charge can migrate. In an embodiment, substrate 302 is a bulk substrate composed of a crystalline silicon, silicon/germanium or germanium layer doped with a charge carrier, such as but not limited to phosphorus, arsenic, boron or a combination thereof, to form active region 304. In one embodiment, the concentration of silicon atoms in bulk substrate 302 is greater than 97%. In another embodiment, bulk substrate 302 is composed of an epitaxial layer grown atop a distinct crystalline substrate, e.g. a silicon epitaxial layer grown atop a boron-doped bulk silicon mono-crystalline substrate. Bulk substrate 302 may alternatively be composed of a group III-V material. In an embodiment, bulk substrate 302 is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, bulk substrate 302 is composed of a III-V material and the charge-carrier dopant impurity atoms are ones such as, but not limited to, carbon, silicon, germanium, oxygen, sulfur, selenium or tellurium.

Isolation region 306 may be composed of a material suitable to ultimately electrically isolate, or contribute to the isolation of, portions of a permanent gate structure from an underlying bulk substrate or isolate active regions formed within an underlying bulk substrate, such as isolating fin active regions. For example, in one embodiment, the isolation region 306 is composed of a dielectric material such as, but not limited to, silicon dioxide, silicon oxy-nitride, silicon nitride, or carbon-doped silicon nitride.

Gate line 308 may be composed of a gate electrode stack which includes a gate dielectric layer 352 and a gate electrode layer 350. In an embodiment, the gate electrode of the gate electrode stack is composed of a metal gate and the gate dielectric layer is composed of a high-K material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the substrate 302. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride.

In one embodiment, the gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer.

Spacers associated with the gate electrode stacks may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

Gate contact 314 and overlying gate contact via 316 may be composed of a conductive material. In an embodiment, one or more of the contacts or vias are composed of a metal species. The metal species may be a pure metal, such as tungsten, nickel, or cobalt, or may be an alloy such as a metal-metal alloy or a metal-semiconductor alloy (e.g., such as a silicide material).

In an embodiment (although not shown), providing structure 300 involves formation of a contact pattern which is essentially perfectly aligned to an existing gate pattern while eliminating the use of a lithographic step with exceedingly tight registration budget. In one such embodiment, this approach enables the use of intrinsically highly selective wet etching (e.g., versus conventionally implemented dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in conventional approaches. In an embodiment, a trench contact grid is not separately patterned, but is rather formed between poly (gate) lines. For example, in one such embodiment, a trench contact grid is formed subsequent to gate grating patterning but prior to gate grating cuts.

Furthermore, the gate stack structure 308 may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at structure 300. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

Referring again to FIG. 3A, the arrangement of semiconductor structure or device 300 places the gate contact over isolation regions. Such an arrangement may be viewed as inefficient use of layout space. In another embodiment, however, a semiconductor device has contact structures that contact portions of a gate electrode formed over an active region. In general, prior to (e.g., in addition to) forming a gate contact structure (such as a via) over an active portion of a gate and in a same layer as a trench contact via, one or more embodiments of the present invention include first using a gate aligned trench contact process. Such a process may be implemented to form trench contact structures for semiconductor structure fabrication, e.g., for integrated circuit fabrication. In an embodiment, a trench contact pattern is formed as aligned to an existing gate pattern. By contrast, conventional approaches typically involve an additional lithography process with tight registration of a lithographic contact pattern to an existing gate pattern in combination with selective contact etches. For example, a conventional process may include patterning of a poly (gate) grid with separate patterning of contact features.

Figure 4A:
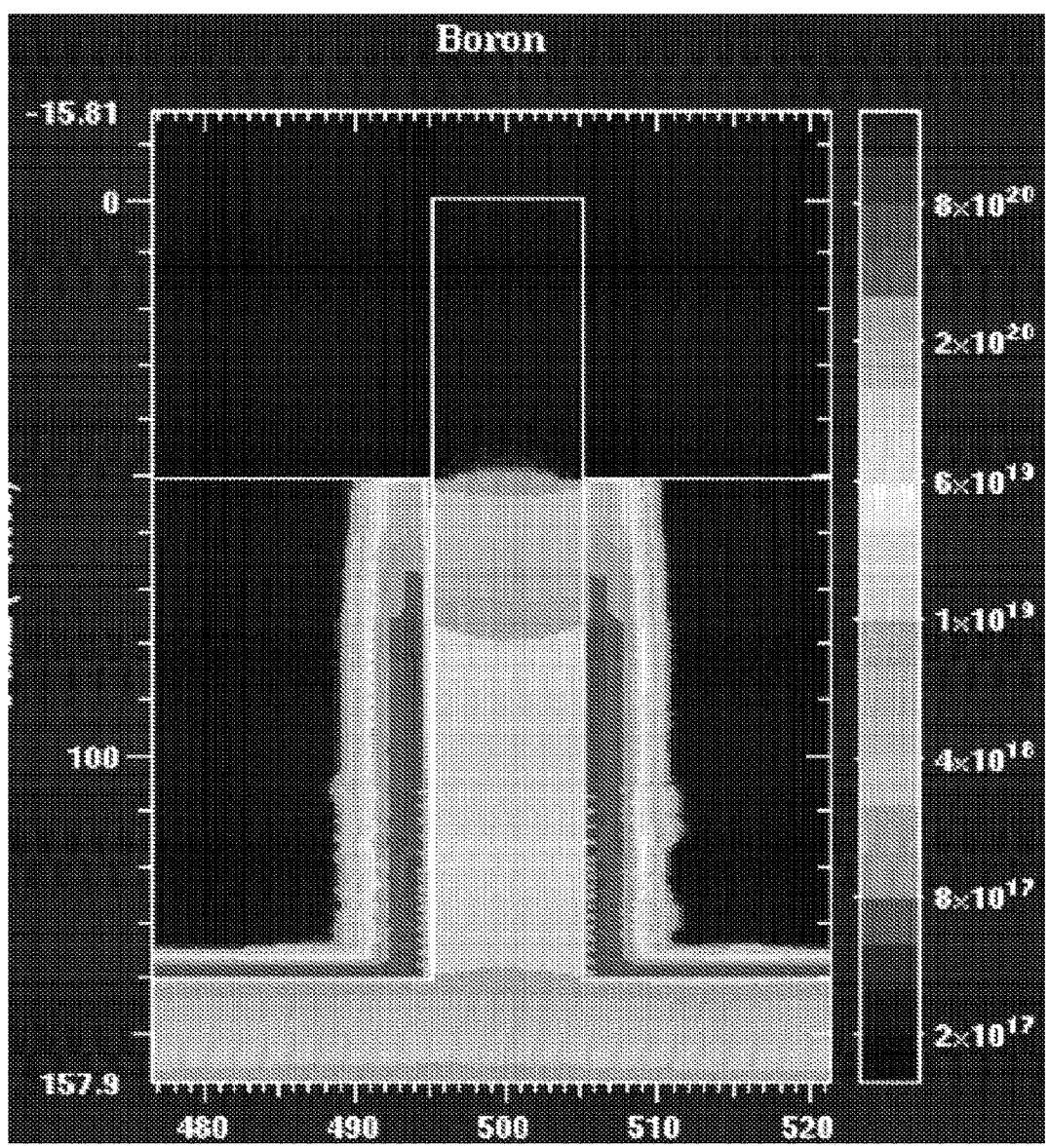
FIG. 4A is a simulated 2-D contour plot demonstrating boron dopant confinement to sub-fin regions, in accordance with an embodiment of the present invention.
Figure 4B:
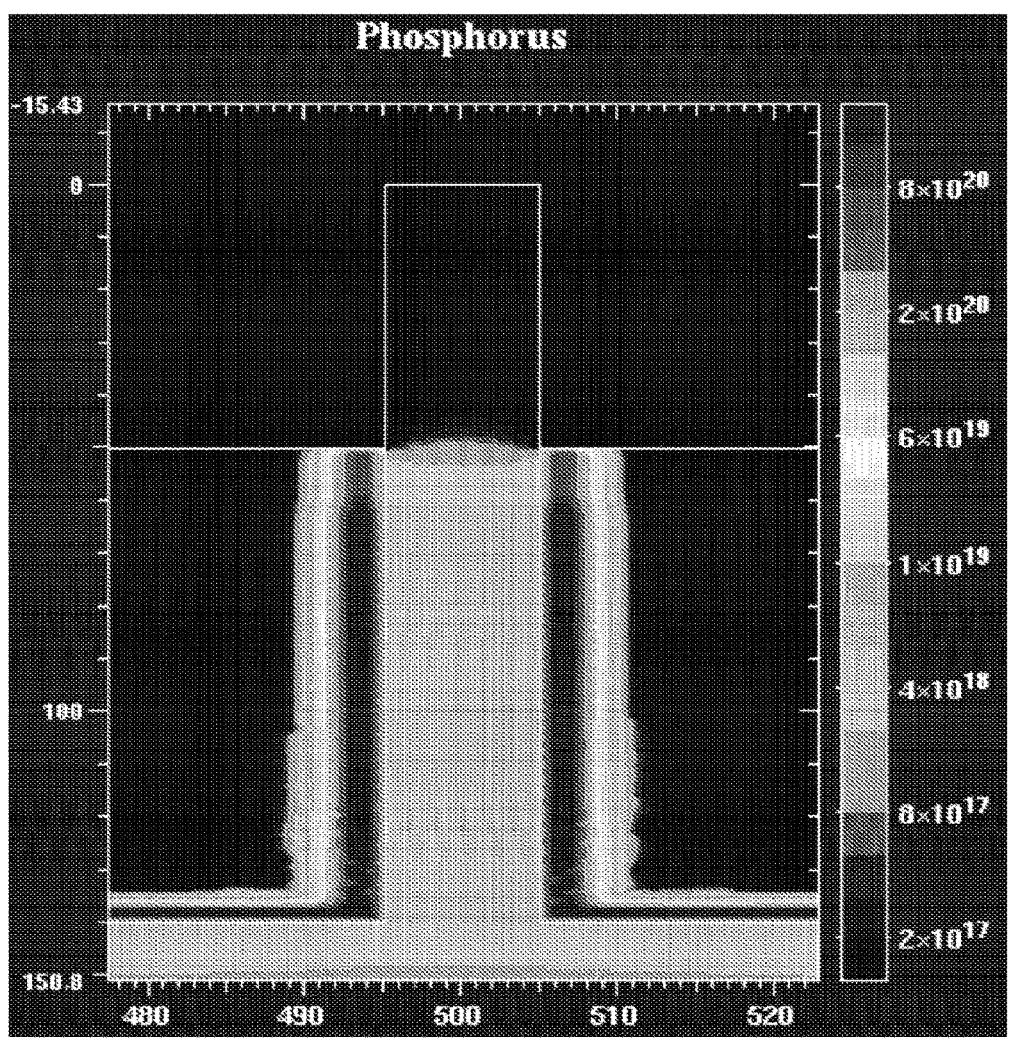
FIG. 4B is a simulated 2-D contour plot demonstrating phosphorus dopant confinement to sub-fin regions, in accordance with an embodiment of the present invention.

As described above, one or more embodiments confine, or essentially confine, dopants from a doping process to a sub-fin region of a semiconductor device. As an example, FIG. 4A is a simulated 2-D contour plot 400 demonstrating boron dopant confinement to sub-fin regions, in accordance with an embodiment of the present invention. In another example, FIG. 4B is a simulated 2-D contour plot 402 demonstrating phosphorus dopant confinement to sub-fin regions, in accordance with an embodiment of the present invention. Referring to FIGS. 4A and 4B, the transition of doping concentration drops quickly from the subfin region to the protruding fin region. In one such embodiment, the transition is essentially immediate with a dopant concentration of less than approximately $5E17$ atoms/cm$^3$ for each of the protruding portions and of greater than approximately $2E18$ atoms/cm$^3$ for the corresponding sub-fin regions.

Figure 5:
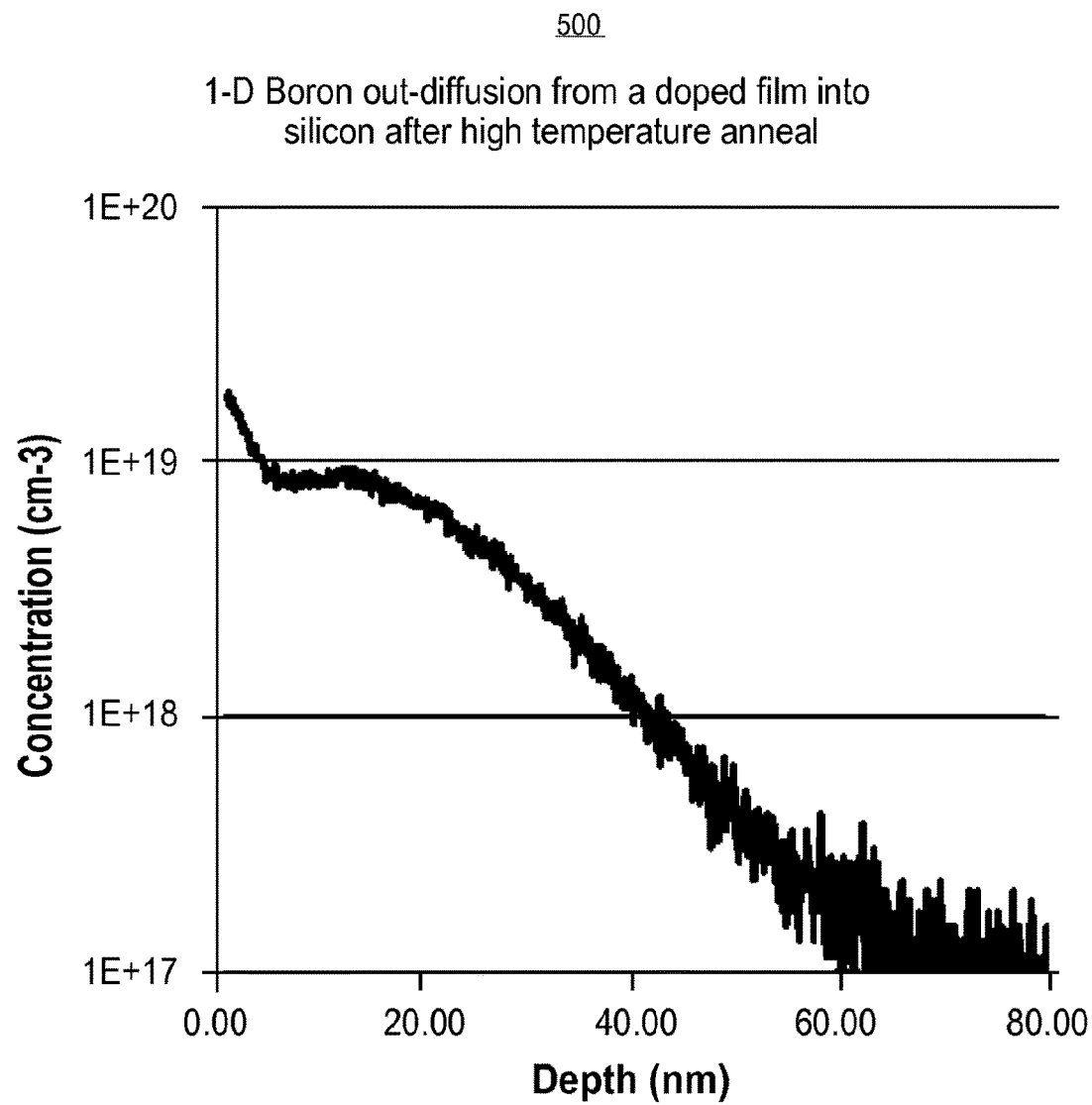
FIG. 5 is a measured 1-D SIMS dopant profile demonstrating diffusion of dopants from a doped insulator layer into a silicon substrate, in accordance with an embodiment of the present invention.

Additionally, as is also described above, substrate portions below the subfin regions may be doped, in one sense forming well regions. In order to exemplify the concept of downward diffusion from a solid state doping source into an underlying substrate, FIG. 5 is a measured 1-D SIMS dopant profile 500 demonstrating diffusion of dopants from a doped insulator layer into a silicon substrate, in accordance with an embodiment of the present invention.

It is to be understood that not all aspects of the processes described above need be practiced to fall within the spirit and scope of embodiments of the present invention. For example, in one embodiment, dummy gates need not ever be formed prior to fabricating gate contacts over active portions of the gate stacks. The gate stacks described above may actually be permanent gate stacks as initially formed. Also, the processes described herein may be used to fabricate one or a plurality of semiconductor devices. The semiconductor devices may be transistors or like devices. For example, in an embodiment, the semiconductor devices are a metal-oxide semiconductor (MOS) transistors for logic or memory, or are bipolar transistors. Also, in an embodiment, the semiconductor devices have a three-dimensional architecture, such as a trigate device, an independently accessed double gate device, or a FIN-FET. One or more embodiments may be particularly useful for fabricating semiconductor devices at a 10 nanometer (10 nm) or smaller technology node.

Figure 6:
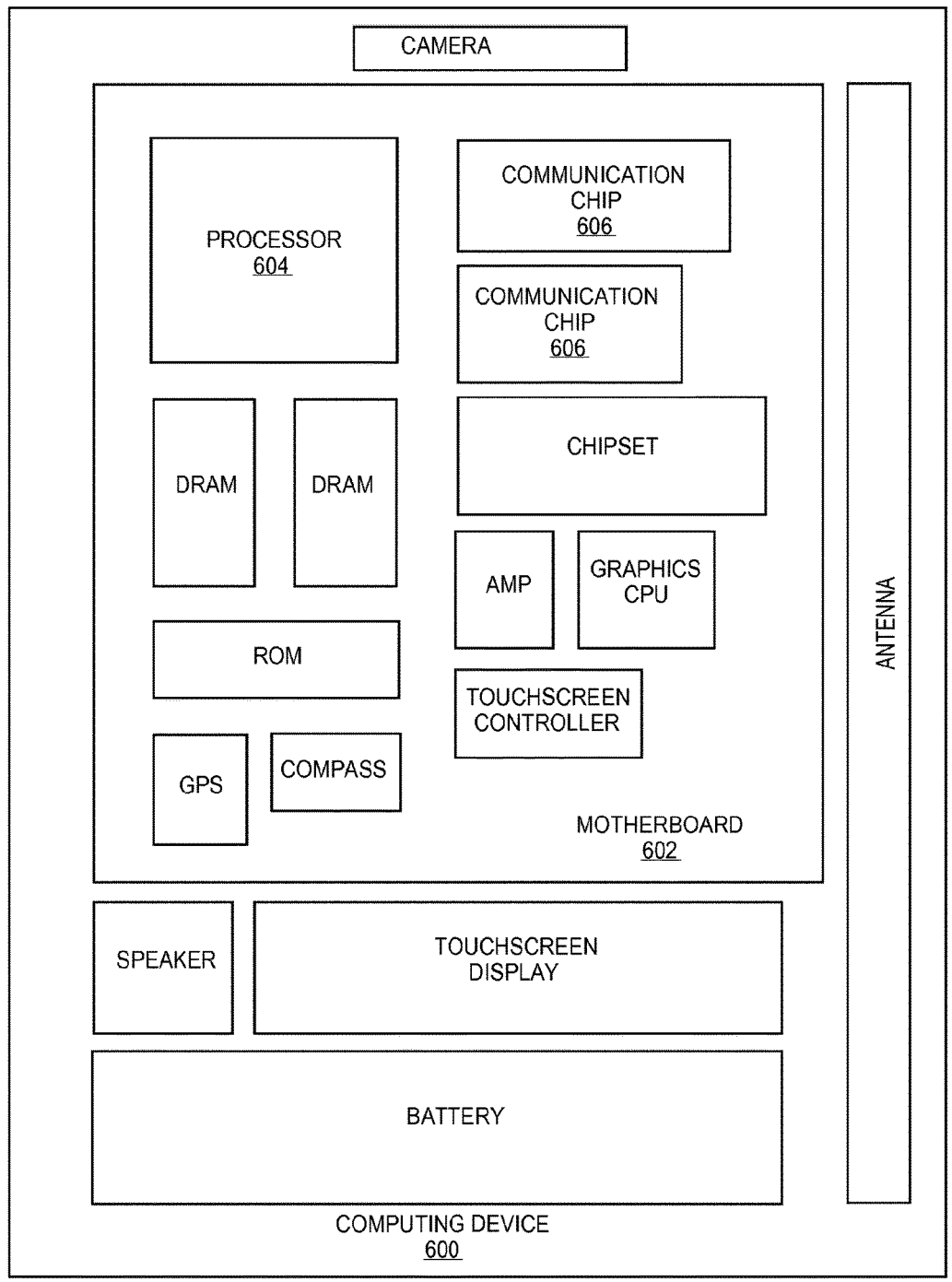
FIG. 6 illustrates a computing device in accordance with one implementation of the invention.

FIG. 6 illustrates a computing device 600 in accordance with one implementation of the invention. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations of embodiments of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another implementation of the invention, the integrated circuit die of the communication chip includes one or more devices, such as MOS-FET transistors built in accordance with implementations of the invention.

In further implementations, another component housed within the computing device 600 may contain an integrated circuit die that includes one or more devices, such as MOS-FET transistors built in accordance with implementations of embodiments of the invention.

In various embodiments, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Thus, embodiments of the present invention include non-planar semiconductor devices having doped sub-fin regions and methods of fabricating non-planar semiconductor devices having doped sub-fin regions.

In an embodiment, a method of fabricating a semiconductor structure involves forming a plurality of semiconductor fins above a semiconductor substrate. A solid state dopant source layer is formed above the semiconductor substrate, conformal with the plurality of semiconductor fins. A dielectric layer is formed above the solid state dopant source layer. The dielectric layer and the solid state dopant source layer are recessed to approximately a same level below a top surface of the plurality of semiconductor fins, exposing protruding portions of each of the plurality of semiconductor fins above sub-fin regions of each of the plurality of semiconductor fins. The method also involves driving dopants from the solid state dopant source layer into the sub-fin regions of each of the plurality of semiconductor fins.

In one embodiment, forming the solid state dopant source layer involves forming a borosilicate glass (BSG) layer.

In one embodiment, forming the solid state dopant source layer involves forming a phosphosilicate glass (PSG) layer or an arsenic silicate glass (AsSG) layer.

In one embodiment, the method further involves forming a gate electrode conformal with the protruding portions of each of the plurality of semiconductor fins, and forming source and drain regions in the protruding portions of each of the plurality of semiconductor fins, on either side of the gate electrode.

In one embodiment, driving dopants from the solid state dopant source layer into the sub-fin regions of each of the plurality of semiconductor fins involves forming a dopant concentration interface between each of the protruding portions and corresponding sub-fin regions of each of the plurality of semiconductor fins.

In one embodiment, forming the plurality of semiconductor fins above the semiconductor substrate involves forming a plurality of single crystalline silicon fins continuous with a bulk single crystalline substrate.

In an embodiment, a method of fabricating a semiconductor structure involves forming first and second pluralities of semiconductor fins above a semiconductor substrate. A P-type solid state dopant source layer is formed above the semiconductor substrate, on and conformal with the first plurality of semiconductor fins. A dielectric layer is formed above the P-type solid state dopant source layer. The dielectric layer and the P-type solid state dopant source layer are planarized to expose a top surface of each of the first and second pluralities of semiconductor fins. N-type dopants are implanted into the second plurality of fins, but not into the first plurality of fins. The dielectric layer and the P-type solid state dopant source layer are recessed to approximately a same level below the top surface of each of the first and second pluralities of semiconductor fins, exposing protruding portions of each of the first and second pluralities of semiconductor fins above sub-fin regions of each of the first and second pluralities of semiconductor fins. The method also involves driving dopants from the P-type solid state dopant source layer into the sub-fin regions of each of the first plurality of semiconductor fins but not the second plurality of semiconductor fins.

In one embodiment, forming the P-type solid state dopant source layer involves forming a global P-type solid state dopant source layer on and conformal with the first and second pluralities of semiconductor fins, and removing the global P-type solid state dopant source layer from the second plurality of semiconductor fins but not the first plurality of semiconductor fins.

In one embodiment, the method further involves, subsequent to removing the global P-type solid state dopant source layer from the second plurality of semiconductor fins but not the first plurality of semiconductor fins, forming a buffer dielectric layer on and conformal with the P-type solid state dopant source layer and on and with the second plurality of semiconductor fins.

In one embodiment, forming the P-type solid state dopant source layer involves forming a borosilicate glass (BSG) layer.

In one embodiment, the method further involves forming an N-type gate electrode conformal with the protruding portions of each of the first plurality of semiconductor fins, forming a P-type gate electrode conformal with the protruding portions of each of the second plurality of semiconductor fins, and forming source and drain regions in the protruding portions of each of the first and second pluralities of semiconductor fins, on either side of the corresponding gate electrode.

In one embodiment, driving dopants from the P-type solid state dopant source layer into the sub-fin regions of each of the first plurality of semiconductor fins involves forming a dopant concentration interface between each of the protruding portions and corresponding sub-fin regions of each of the first plurality of semiconductor fins.

In one embodiment, forming the first and second pluralities of semiconductor fins above the semiconductor substrate involves forming first and second pluralities of single crystalline silicon fins continuous with a bulk single crystalline substrate.

In an embodiment, a method of fabricating a semiconductor structure involves forming first and second pluralities of semiconductor fins above a semiconductor substrate. A P-type solid state dopant source layer is formed above the semiconductor substrate, on and conformal with the first plurality of semiconductor fins. An N-type solid state dopant source layer is formed above the semiconductor substrate, on and conformal with the second plurality of semiconductor fins. A dielectric layer is formed above the P-type solid state dopant source layer and above the N-type solid state dopant source layer. The dielectric layer, the P-type solid state dopant source layer and the N-type solid state dopant source layer are recessed to approximately a same level below a top surface of each of the first and second pluralities of semiconductor fins, exposing protruding portions of each of the first and second pluralities of semiconductor fins above sub-fin regions of each of the first and second pluralities of semiconductor fins. The method also involves driving dopants from the P-type solid state dopant source layer into the sub-fin regions of each of the first plurality of semiconductor fins but not the second plurality of semiconductor fins, and driving dopants from the N-type solid state dopant source layer into the sub-fin regions of each of the second plurality of semiconductor fins but not the first plurality of semiconductor fins.

In one embodiment, the driving dopants from the P-type solid state dopant source layer into the sub-fin regions of each of the first plurality of semiconductor fins and the driving dopants from the N-type solid state dopant source layer into the sub-fin regions of each of the second plurality of semiconductor fins are performed in a same process operation.

In one embodiment, forming the P-type solid state dopant source layer involves forming a global P-type solid state dopant source layer on and conformal with the first and second pluralities of semiconductor fins, and removing the global P-type solid state dopant source layer from the second plurality of semiconductor fins but not the first plurality of semiconductor fins.

In one embodiment, the method further involves, subsequent to removing the global P-type solid state dopant source layer from the second plurality of semiconductor fins, forming a buffer dielectric layer on and conformal with the P-type solid state dopant source layer.

In one embodiment, forming the N-type solid state dopant source layer involves forming a global N-type solid state dopant source layer on and conformal with the second plurality of semiconductor fins and above the P-type solid state dopant source layer, and removing the global N-type solid state dopant source layer from above the P-type solid state dopant source layer but not from the second plurality of semiconductor fins.

In one embodiment, the method further involves, subsequent to removing the global N-type solid state dopant source layer from above the P-type solid state dopant source layer, forming a buffer dielectric layer on and conformal with the N-type solid state dopant source layer and on and conformal with the P-type solid state dopant source layer.

In one embodiment, forming the P-type solid state dopant source layer involves forming a borosilicate glass (BSG) layer, and forming the N-type solid state dopant source layer involves forming a phosphosilicate glass (PSG) layer or an arsenic silicate glass (AsSG) layer.

In one embodiment, the method further involves forming an N-type gate electrode conformal with the protruding portions of each of the first plurality of semiconductor fins, forming a P-type gate electrode conformal with the protruding portions of each of the second plurality of semiconductor fins, and forming source and drain regions in the protruding portions of each of the first and second pluralities of semiconductor fins, on either side of the corresponding gate electrode.

In one embodiment, driving dopants from the P-type solid state dopant source layer into the sub-fin regions of each of the first plurality of semiconductor fins involves forming a dopant concentration interface between each of the protruding portions and corresponding sub-fin regions of each of the first plurality of semiconductor fins, and driving dopants from the N-type solid state dopant source layer into the sub-fin regions of each of the second plurality of semiconductor fins involves forming a dopant concentration interface between each of the protruding portions and corresponding sub-fin regions of each of the second plurality of semiconductor fins.

In one embodiment, forming the first and second pluralities of semiconductor fins above the semiconductor substrate involves forming first and second pluralities of single crystalline silicon fins continuous with a bulk single crystalline substrate.

In an embodiment, a semiconductor structure includes a plurality of semiconductor fins disposed above a semiconductor substrate. A solid state dopant source layer is disposed above the semiconductor substrate, conformal with sub-fin regions of each of the plurality of semiconductor fins but only to a level below a top surface of the plurality of semiconductor fins, exposing protruding portions of each of the plurality of semiconductor fins above the sub-fin regions of each of the plurality of semiconductor fins. A dielectric layer is disposed above the solid state dopant source layer, the dielectric layer having a top surface approximately co-planar with the level below the top surface of the plurality of semiconductor fins. A dopant concentration interface is between each of the protruding portions and corresponding sub-fin regions of each of the plurality of semiconductor fins.

In one embodiment, the solid state dopant source layer is a borosilicate glass (BSG) layer.

In one embodiment, the solid state dopant source layer is a phosphosilicate glass (PSG) layer or an arsenic silicate glass (AsSG) layer.

In one embodiment, the semiconductor structure further includes a gate electrode disposed conformal with the protruding portions of each of the plurality of semiconductor fins, and source and drain regions disposed in the protruding portions of each of the plurality of semiconductor fins, on either side of the gate electrode.

In one embodiment, the plurality of semiconductor fins disposed above the semiconductor substrate is a plurality of single crystalline silicon fins continuous with a bulk single crystalline substrate.

In one embodiment, the dopant concentration interface is an abrupt transition of less than approximately $5E17$ atoms/$cm^3$ for each of the protruding portions and of greater than approximately $2E18$ atoms/$cm^3$ for the corresponding sub-fin regions of each of the plurality of semiconductor fins.

What is claimed is:

1. An integrated circuit structure, comprising:
    a first fin comprising silicon, the first fin having a lower fin portion and an upper fin portion, the first fin of an NMOS device;
    a second fin comprising silicon, the second fin having a lower fin portion and an upper fin portion, the second fin of a PMOS device;
    a first dielectric layer comprising silicon and oxygen, the first dielectric layer directly on sidewalls of the lower fin portion of the first fin;
    a second dielectric layer comprising silicon and oxygen, the second dielectric layer directly on sidewalls of the lower fin portion of the second fin;
    an insulating layer comprising nitrogen, the insulating layer over the first dielectric layer and over the second dielectric layer, and the insulating layer continuous over the first dielectric layer and the second dielectric layer;
    a dielectric fill material directly on the insulating layer, wherein the dielectric fill material comprises silicon and oxygen;
    a first gate electrode over a top of and laterally adjacent to sidewalls of the upper fin portion of the first fin, the first gate electrode over the dielectric fill material; and
    a second gate electrode over a top of and laterally adjacent to sidewalls of the upper fin portion of the second fin, the second gate electrode over the dielectric fill material.

2. The integrated circuit structure of claim 1, wherein the first dielectric layer comprises boron, and wherein the second dielectric layer comprises phosphorous.

3. The integrated circuit structure of claim 1, wherein the first dielectric layer comprises a borosilicate glass (BSG), and wherein the second dielectric layer comprises a phosphosilicate glass (PSG).

4. The integrated circuit structure of claim 1, wherein the first dielectric layer comprises boron, and wherein the second dielectric layer comprises arsenic.

5. The integrated circuit structure of claim 1, wherein the first dielectric layer comprises a borosilicate glass (BSG), and wherein the second dielectric layer comprises an arsenic-silicate glass (AsSG).

6. The integrated circuit structure of claim 1, wherein the first dielectric layer is discrete from but in contact with the second dielectric layer.

7. The integrated circuit structure of claim 6, wherein the first dielectric layer and the second dielectric layer meet at an approximately vertical interface between the first fin and the second fin.

8. The integrated circuit structure of claim 1, wherein the insulating is directly on the first dielectric layer, and wherein the insulating layer is not directly on the second dielectric layer.

9. The integrated circuit structure of claim 8, further comprising a second insulating layer comprising nitrogen, the second insulating layer between the second dielectric layer and the insulating layer.

10. The integrated circuit structure of claim 1, wherein the first and second fins are continuous with a bulk single crystalline substrate.

11. A computing device, comprising:
a board; and
a component coupled to the board, the component including an integrated circuit structure, comprising:
 a first fin comprising silicon, the first fin having a lower fin portion and an upper fin portion, the first fin of an NMOS device;
 a second fin comprising silicon, the second fin having a lower fin portion and an upper fin portion, the second fin of a PMOS device;
 a first dielectric layer comprising silicon and oxygen, the first dielectric layer directly on sidewalls of the lower fin portion of the first fin;
 a second dielectric layer comprising silicon and oxygen, the second dielectric layer directly on sidewalls of the lower fin portion of the second fin;
 an insulating layer comprising nitrogen, the insulating layer over the first dielectric layer and over the second dielectric layer, and the insulating layer continuous over the first dielectric layer and the second dielectric layer;
 a dielectric fill material directly on the insulating layer, wherein the dielectric fill material comprises silicon and oxygen;
 a first gate electrode over a top of and laterally adjacent to sidewalls of the upper fin portion of the first fin, the first gate electrode over the dielectric fill material; and
 a second gate electrode over a top of and laterally adjacent to sidewalls of the upper fin portion of the second fin, the second gate electrode over the dielectric fill material.

12. The computing device of claim 11, further comprising: a memory coupled to the board.

13. The computing device of claim 11, further comprising: a communication chip coupled to the board.

14. The computing device of claim 11, further comprising: a camera coupled to the board.

15. The computing device of claim 11, further comprising: a display coupled to the board.

16. The computing device of claim 11, further comprising: a battery coupled to the board.

17. The computing device of claim 11, further comprising: an antenna coupled to the board.

18. The computing device of claim 11, wherein the component is a packaged integrated circuit die.

19. The computing device of claim 11, wherein the component is selected from the group consisting of a processor, a communications chip, and a digital signal processor.

20. The computing device of claim 11, wherein the computing device is selected from the group consisting of a mobile phone, a laptop, a desk top computer, a server, and a set-top box.

* * * * *